US010198369B2

(12) United States Patent
Eckert et al.

(10) Patent No.: US 10,198,369 B2
(45) Date of Patent: Feb. 5, 2019

(54) DYNAMIC MEMORY REMAPPING TO REDUCE ROW-BUFFER CONFLICTS

(71) Applicant: Advanced Micro Devices, Inc., Sunnyvale, CA (US)

(72) Inventors: Yasuko Eckert, Redmond, WA (US); Reena Panda, Austin, TX (US); Nuwan Jayasena, Sunnyvale, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/469,071

(22) Filed: Mar. 24, 2017

(65) Prior Publication Data

US 2018/0276150 A1    Sep. 27, 2018

(51) Int. Cl.
*G06F 13/16* (2006.01)
*G06F 13/40* (2006.01)
*G06F 3/06* (2006.01)

(52) U.S. Cl.
CPC .......... *G06F 13/1642* (2013.01); *G06F 3/065* (2013.01); *G06F 3/0619* (2013.01); *G06F 3/0653* (2013.01); *G06F 3/0673* (2013.01); *G06F 13/1673* (2013.01); *G06F 13/4068* (2013.01)

(58) Field of Classification Search
CPC .............................. G06F 3/065; G06F 3/0619
See application file for complete search history.

(56) References Cited

U.S. PATENT DOCUMENTS

| 5,862,314 A | 1/1999 | Jeddelloh | |
|---|---|---|---|
| 6,249,855 B1 * | 6/2001 | Farrell | G06F 9/3836 712/212 |
| 9,330,020 B2 * | 5/2016 | Caprioli | G06F 12/1009 |
| 2008/0109612 A1 * | 5/2008 | Jones | G06F 12/0238 711/154 |
| 2009/0106506 A1 * | 4/2009 | Skerlj | G06F 12/02 711/154 |
| 2014/0006704 A1 * | 1/2014 | Greenfield | G06F 11/3037 711/106 |

(Continued)

OTHER PUBLICATIONS

R. Karp et al., "A Simple Algorithm for Finding Frequent Elements in Streams and Bags," ACM Transactions on Database Systems, vol. 28, No. 1, Mar. 2003, pp. 51-55.

(Continued)

*Primary Examiner* — Farley Abad
(74) *Attorney, Agent, or Firm* — Polansky & Associates, P.L.L.C.; Paul J. Polansky

(57) ABSTRACT

A data processing system includes a memory that includes a first memory bank and a second memory bank. The data processing system also includes a conflict detector connected to the memory and adapted to receive memory access information. The conflict detector tracks memory access statistics of the first memory bank, and determines if the first memory bank contains frequent row conflicts. The conflict detector also remaps a frequent row conflict in the first memory bank to the second memory bank. An indirection table is connected to the conflict detector and adapted to receive a memory access request, and redirects an address into a dynamically selected physical memory address in response to a remapping of the frequent row conflict to the second memory bank.

29 Claims, 8 Drawing Sheets

(56) References Cited

U.S. PATENT DOCUMENTS

2016/0202926 A1  7/2016  Benedict

OTHER PUBLICATIONS

M. Charikar et al., "Finding frequent items in data streams," Theoretical Computer Science, vol. 312, No. 1, pp. 3-15, 2004.
International Search Report and Written Opinion for International Application No. PCT/US17/68522, dated Apr. 10, 2018, 16 pages.

* cited by examiner

DYNAMIC MEMORY REMAPPING TO REDUCE ROW-BUFFER CONFLICTS

STATEMENT REGARDING GOVERNMENT SPONSORED RESEARCH

This invention was made with Government support under (FastForward-2 Node Architecture (NA) Project with Lawrence Livermore National Laboratory (Prime Contract No. DE-AC52-07NA27344, Subcontract No. B609201)) awarded by the DOE. The Government has certain rights in this invention.

BACKGROUND

Memory within a computer system is typically associated with addressable semiconductor memory, or integrated circuits utilized as the primary storage of the computer system. There are two main types of semiconductor memory, volatile and non-volatile. Non-volatile memory is typically flash memory in current systems and is often utilized as secondary memory. Volatile memory, or main memory, is often a dynamic random-access memory (DRAM) based architecture. Data flows back and forth between the processor and the DRAM main memory over memory buses. Continuously increasing processor speeds and growing main memory requirements are contributing to performance and energy bottlenecks in computing systems.

DRAM devices employ row buffers (at least one per bank) in which memory reads and writes take place. Accesses to a DRAM row that is different from the one in the row buffer requires closing the currently buffered or open row and activating the requested row, which is referred to as a row-buffer conflict and incurs performance and energy penalties. DRAM row-buffer conflicts limit the optimal exploitation of the available memory bandwidth and increase the memory-access latencies due to closing and activating DRAM rows. Memory-access conflicts are further increased by sub-optimal physical-address allocations by the operating system (OS). Further, software memory access patterns frequently cause accesses to contend for the same row buffer causing thrashing and forcing rows to be closed after only a few accesses, thereby reducing the performance and energy efficiency of memory systems.

Figure 1:
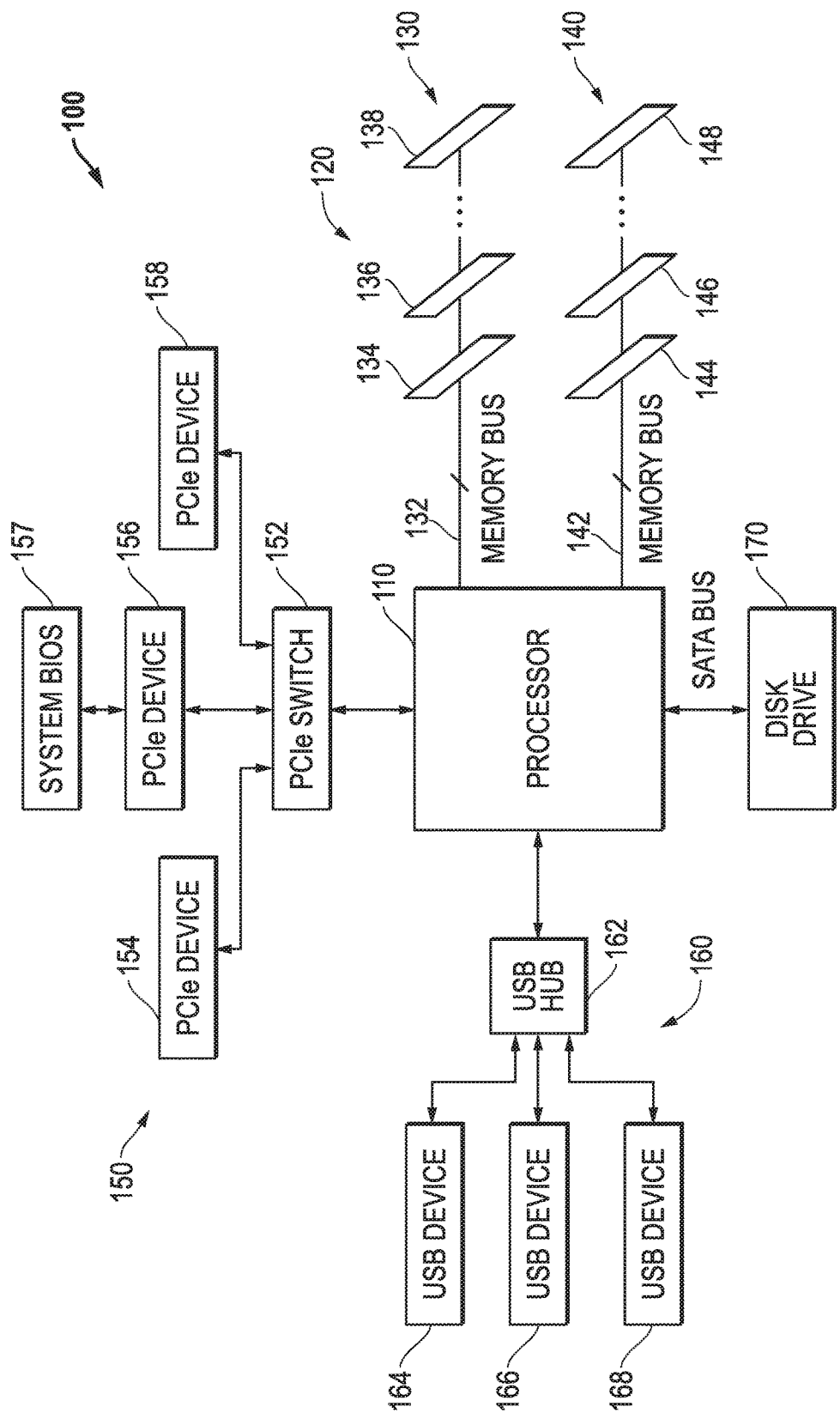
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described below in one form, a memory controller includes a queue, an arbiter, a conflict detector, and an indirection table. The queue is connected to the arbiter for selecting entries from the queue. The conflict detector is connected to the arbiter and identifies a frequent conflict in response to a number of row-buffer conflicts in a subset of a memory exceeding a threshold. Additionally, the conflict detector selectively triggers remapping of a memory row associated with the frequent conflict from a first memory bank to a less conflicting memory row in a second memory bank. The indirection table is connected to the conflict detector and to the queue and selectively provides a remapped address and a hit signal indicating that data in the subset of memory for the physical memory address has been remapped to another subset of memory, or a miss signal indicating the data in the subset has not been remapped to another set of memory.

In yet another form, a data processing system includes a memory, a conflict detector, and an indirection table. The memory includes a first memory bank and a second memory bank. The conflict detector is connected to the memory and receives memory access information. The conflict detector tracks memory access statistics of the first memory bank, and determines if the first memory bank contains frequent performance-critical row conflicts. Additionally, the conflict detector remaps a frequent performance-critical row conflict in the first memory bank to the second memory bank. The indirection table is connected to the conflict detector and receives a memory access request. In response to a remapping of the frequent performance-critical row conflict to the second memory bank, the indirection table redirects an address into a dynamically selected physical memory address in the second memory bank.

In still another form there is described a method for conflict detection based on access statistics to a subset of memory. The closure of an open row in the subset of the memory is detected. The activity of at least one row in the subset of the memory is selectively monitored. In response to a row associated with the most recent row closure, row access statistics corresponding to the row are updated in a tracking system. In response to the row associated with the most recent row activity not being in the tracking system, the conflict detector replaces row access statistics of a not-recently accessed row or a most accesses per activation row, in the tracking system, with the row access statistics associated with a most recent row closure. For at least one row in the subset of the memory a row accesses per activation count is compared to a predetermined row accesses per activation threshold to determine if a row is a candidate for remapping.

In still another form, a method for remapping memory and allocating an indirection table entry, in a subset of memory, includes detecting, at an indirection table, a request for remapping a row from a conflict detector. At least one row in the different bank is identified as reserved and available for remapping. Further, at least one memory row is identified as slated to receive a remapped memory row. The data is copied from the conflict rows to identified rows in the different bank with fewer conflicts, and the indirection table is updated.

FIG. 1 illustrates in block diagram form a data processing system 100 according to some embodiments. Data processing system 100 includes generally a data processor 110, a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a memory bus 132, including representative DIMMs 134, 136, and 138 that in this example correspond to separate ranks. Likewise, memory channel 140 includes a set of DIMMs connected to a memory bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing memory channel 130 and memory channel 140. Each of memory channels 130 and 140 can connect to DDR memories such as DDR version 4 (DDR4), low power DDR4 (LPDDR4), graphics DDR version five (gDDR5), and high bandwidth memory (HBM), and can be adapted for future memory technologies. These memories provide high bus bandwidth and high speed operation.

Figure 2:
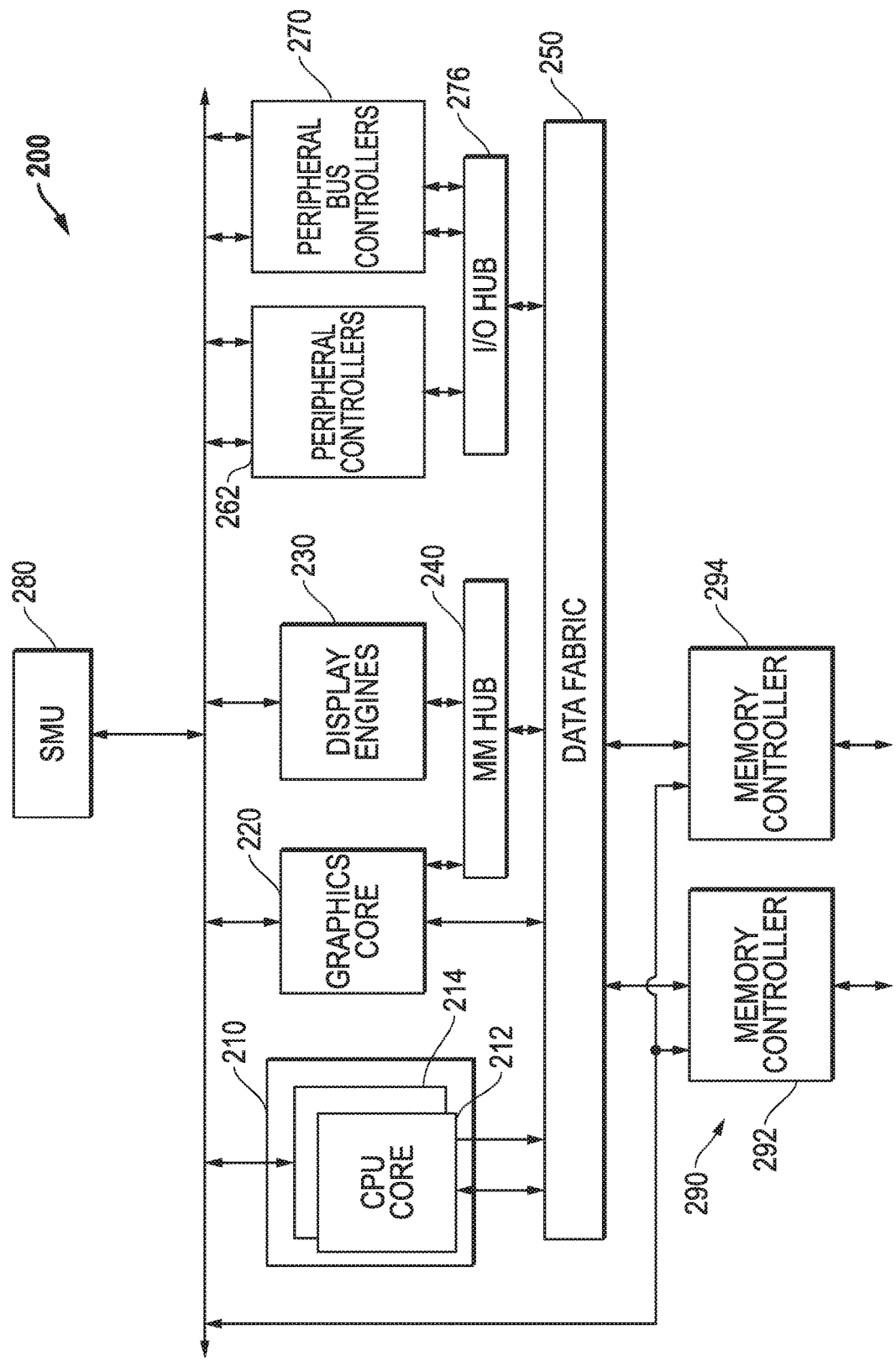
FIG. 2 illustrates in block diagram form a processing unit suitable for use in the data processing system of FIG. 1.

FIG. 2 illustrates in block diagram form a data processor 200 suitable for use in data processing system 100 of FIG. 1. Data processor 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290 (memory controller 292 and 294).

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bi-directionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, data processor 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bi-directionally connected to a common memory management hub 240 for uniform translation into appropriate addresses in memory system 120, and memory management hub 240 is bi-directionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bi-directionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bi-directionally connected to an input/output (I/O) hub 276 and to the SMN bus. I/O hub 276 is also bi-directionally connected to data fabric 250.

SMU 280 is a local controller that controls the operation of the resources on data processor 200 and synchronizes communication among them. SMU 280 manages power-up sequencing of the various processors on data processor 200 and controls multiple off-chip devices via reset, enable and other signals. SMU 280 includes one or more clock sources not shown in FIG. 2, such as a phase locked loop (PLL), to provide clock signals for each of the components of data processor 200. SMU 280 also manages power for the various processors and other functional blocks, and may receive measured power consumption values from CPU cores 212 and 214 and graphics core 220 to determine appropriate power states.

Figure 3:
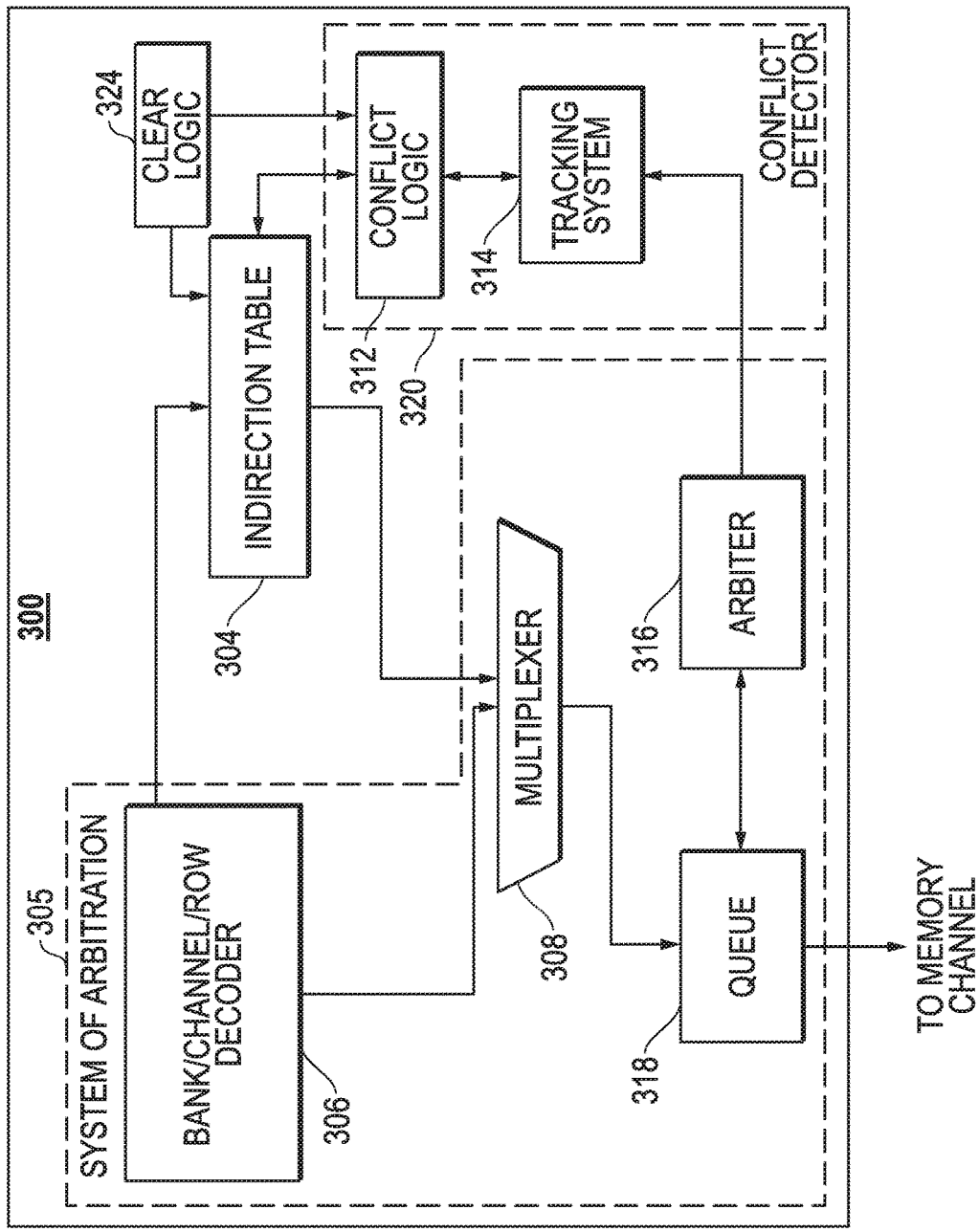
FIG. 3 illustrates in block diagram form a memory controller and associated system of arbitration and conflict detector suitable for use in the processing unit of FIG. 2 according to some embodiments.

FIG. 3 illustrates in block diagram form a memory controller 300 for use in data processor 200 of FIG. 2 according to some embodiments. Memory controller 300 generally includes a system of arbitration 305 and an indirection table 304, a conflict detector 320, and clear logic 324. System of arbitration 305 includes bank/channel/row decoder 306, multiplexer 308, arbiter 316, and queue 318. Conflict detector 320 includes conflict logic 312 and tracking system 314. Memory controller 300 is an instantiation of a memory controller for a single memory channel.

Bank/row/channel decoder 306 includes an input for receiving memory access requests from data fabric 250, and an output for providing the physical memory address to multiplexer 308 and indirection table 304. The memory access requests include access addresses in the physical address space represented in a normalized format. Bank/row/channel decoder 306 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and provides the size and configuration to conflict detector 320. Additionally, bank/row/channel decoder 306 decodes the physical memory address information into rank, row address, column address, bank address, and bank group in the memory system. Bank/row/channel decoder 306 provides the decoded memory address to multiplexer 308.

Multiplexer 308 includes a first input connected to bank/row/channel decoder 306, a second input, a control input for receiving the hit signal, and an output. The second input, connected to indirection table 304, is for receiving the remapped address. The output signal is connected to queue 318.

Queue 318 includes an input connected to the output of the multiplexer 308, a control input, and an output. Queue 318 processes memory access requests received from the memory accessing agents in data processing system 100, such as CPU cores 212 and 214 and graphics core 220. Queue 318 stores the address fields provided by multiplexer 308, as well other address information that allows arbiter 316 to select memory accesses efficiently.

Arbiter 316 schedules the decoded physical memory addresses awaiting memory access in the queue 318 and provides an update to the tracking system 314, is bi-directionally connected to queue 318, and is connected to tracking system 314. The update to the tracking system corresponds to the memory access statistics of the dynamically selected physical memory addresses. Arbiter 316 includes information to enforce ordering rules when selecting memory accesses, and enables efficiency by scheduling of accesses to the memory bus. Arbiter 316 uses timing to enforce proper timing relationships by determining whether certain accesses in queue 318 are eligible for issuance based on DRAM timing parameters.

Conflict detector 320 includes conflict logic 312 and tracking system 314. Conflict logic 312 determines, from the memory access statistics, when a memory row may cause frequent row conflicts and is bi-directionally connected to indirection table 304 and tracking system 314. A frequent row conflict is a number of row-buffer conflicts in a subset of a memory exceeding a threshold. The frequent row conflict occurs when the memory row activation count is higher than a defined activation count threshold, and the memory access per activation count is lower than a defined access per activation count threshold. Conflict logic 312 provides the logic that controls select operations of conflict detector 320. Although described as a component of memory controller 300, in one embodiment, conflict detector 320 is a separate component from memory controller 300. Tracking system 314 stores memory access statistics, and is bi-directionally connected to conflict logic 312 and receives arbitrated inputs from arbiter 316. Tracking system 314 is implemented as a cache memory, a table of access statistics, or an algorithm for tracking memory row access counts.

Conflict detector 320 tracks the memory access statistics for the first memory bank, and determines if the first memory bank contains a frequent conflict row. In response to detecting the existence of the frequent conflict row, the conflict detector 320 triggers the migration of the frequent conflict row to an available row in the second memory bank. The data processing system also includes an indirection table 304 connected to the conflict detector 320 that maintains a record of migrated rows. After the migration of the frequent conflict row, the indirection table 304 receives a memory request and remaps requests to the frequent conflict row in the first memory bank to the row in the second memory bank it was migrated to.

Indirection table 304 maintains state information about select (remapped) memory pages in each bank and rank of the memory channel for arbiter 316, and is connected to conflict logic 312. Additionally, indirection table 304 has an input connected to bank/row/channel decoder 306 and clear content logic 324, and an output connected to multiplexer 308.

Clear content logic 324 includes an output to indirection table 304 and an output to conflict logic 312. Clear content logic 324 generates refresh commands periodically to indirection table 304 and conflict logic 312. Additionally, clear content logic 324 allows the manual and automatic generation of commands to clear and/or reset the content of indirection table 304 and conflict logic 312.

In operation, a memory controller such as memory controller 300 of FIG. 3 is connected to and receives memory access requests from a memory accessing agent, such as a CPU core in CPU core complex 210 or graphics core 220 of FIG. 2. Memory controller 300 is also adapted to connect to memory system 120 of FIG. 1. As described above, memory system 120 can include multiple ranks of memory implemented as DIMMs 134, 136, and 138 in FIG. 1. Arbiter 316 picks memory access requests from queue 318 based on predetermined criteria based on performance and efficiency consideration. In response to a memory bus access request, conflict detector 320 monitors activity in a memory bank to selectively track performance-critical patterns.

In one embodiment, conflict detector 320 monitors DRAM-row granularity access statistics and detects performance-critical conflicts. In general, bank/row/channel decoder 306 receives memory access requests and provides the decoded physical address to multiplexer 308 and indirection table 304. Queue 318 stores memory access requests that are selectively provided by the bank/channel/row decoder 306 or the indirection table 304 via multiplexer 308. Arbiter 316 selects memory requests from among those pending in queue 318 to issue to the memory channel. Tracking system 314 detects the access to each memory row and monitors the memory row activation count and a memory row accesses per activation count. A row with an activation count higher than a predetermined activation count and an access per activation count lower than a predetermined access per activation is considered performance-critical and is marked by conflict logic 312 as a remapping candidate.

For example, tracking system 314 maintains row-access information for the C most-recently-accessed rows for each DRAM bank in a memory cache, where C is the number of entries in the memory cache per DRAM bank. Each entry tracks the number of activations and an approximate running average of the number of accesses per activation for the corresponding DRAM row. An update to tracking system 314 is made when a currently open row, R, is being closed. If there is no existing entry for row R in tracking system 314, an entry is inserted using a memory row granularity replacement policy. In one embodiment, the memory row granularity replacement policy replaces the entry for the least-recently-accessed row with an entry for row R. In another embodiment, the replacement policy replaces the entry in tracking system 314 with the highest average accesses per activation (i.e., the one that is typically least likely to be performance-critical) with an entry for row R if the number of accesses to row R since row R was activated is fewer than the average accesses per activation in the entry being replaced. If an entry for row R already exists in tracking system 314, then it is updated. Subsequently, the updated row-access statistics of an entry is checked to see if the row has more than N activations and fewer than M average accesses per activation, where N and M are predefined or dynamically adjusted thresholds. If so, the row R is experiencing frequent performance-critical page conflicts and becomes a candidate for migration.

A bank with few or no heavily conflicted rows is the destination for the migration. Such bank may have 1) no rows with more than N activations, 2) no rows with fewer than M average accesses per activation, or 3) a combination of 1 and 2, where N and M are the same as the previously defined variables.

In one embodiment, tracking system 314 maintains a rate of the frequent performance-critical page conflicts by implementing a cache with memory row granularity replacement policy, a tracking algorithm, or a table of access statistics. The memory row granularity replacement policy can be implemented within a memory cache. A tracking algorithm can be implemented by determining rows with performance-critical row conflicts.

For example, the Majority Element Algorithm (MEA) may be used to identify rows that are most-frequently opened and closed with fewer than a threshold number of intervening accesses. MEA is a data analytics algorithm that enables identification of the most frequently-occurring elements in a stream of data elements. The sequence of rows that are opened and closed with fewer than a threshold number of intervening accesses are the target data elements. The tracking algorithm of the MEA stores the most frequently occurring elements with high probability, thereby providing the rows with frequent performance-critical page conflicts to conflict logic 312.

Additionally, a table of access statistics may be implemented as tracking system 314. The table of access statistics is a full table with an entry for every DRAM row. The table of access statistics can be used to determine frequent performance-critical page conflicts by searching for rows that have more than N activations and fewer than M average accesses per activation, where N and M are predefined or dynamically adjusted thresholds. The row-granularity tracking statistics and data structures may be cleared and/or re-initialized, via clear content logic 324, periodically or at specific points (e.g., starting up a new application) to avoid the influence of long-past events that are no longer relevant.

In another embodiment, per-bank statistics on activations and accesses per activation are maintained. In general, thresholds N and M are used to determine if a bank has frequent performance-critical row conflict (i.e., more than N activations and less than M average accesses per activation). If so, specific rows from that bank to migrate can be determined. A first example of determining rows to migrate includes identifying the bank has frequent performance-critical row conflicts, the very next one or more rows that are opened in that bank and are closed with less than a threshold number of accesses are remapped.

In still another embodiment, in addition to per-bank statistics of row openings and accesses, statistics are maintained for a predetermined number of rows in each bank. When a row R is closed, if the number of accesses to row R since it was last opened is fewer than a predetermined threshold, T, the row identification and number of accesses is inserted into tracking system 314. If the set of tracked entries is full, the new entry may displace an existing entry. The displaced entry may be the oldest entry in the set or the entry with the highest access count. In one or more embodiments, the new entry (for row R) may not be inserted into the set if it has an access count that is greater than the access counts of all entries in the set of rows for which statistics are maintained. When a bank is determined to have frequent performance-critical row conflict, one or more of the tracked rows within tracking system 314 with fewer than a threshold number of accesses in their last activation are remapped.

Figure 4:
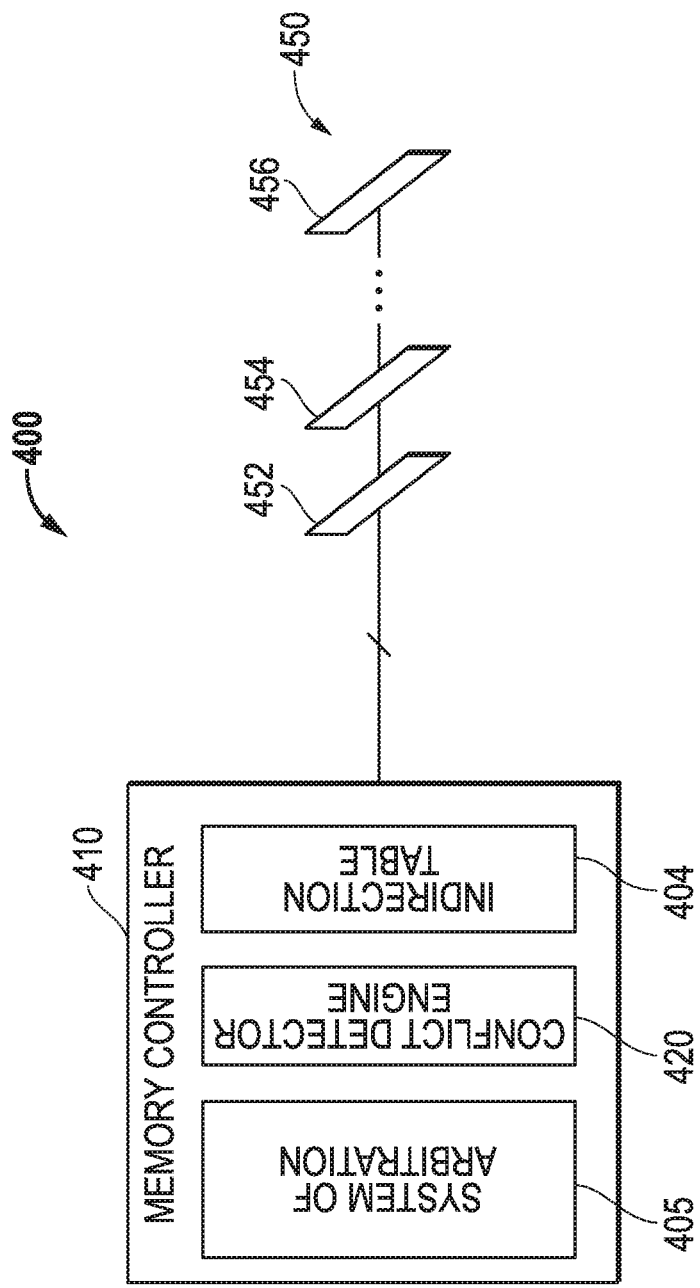
FIG. 4 illustrates in block diagram form a memory controller and associated memory bus for use in the processing unit of FIG. 2 according to some embodiments.

FIG. 4 illustrates a memory controller and associated memory bus for dynamic memory remapping. Memory system 400 includes memory controller 410, system of arbitration 405, conflict detector engine 420, and indirection table 404. Memory system 400 includes a memory channel 450. Memory channel 450 includes a set of memory modules connected to a memory bus, including representative memory modules 452, 454, and 456 connect to memory bus 450. In this example, the memory modules correspond to separate ranks.

Indirection table 404, similar to indirection table 304, maintains state information about active pages in each bank and rank of the memory channel that have been remapped. Conflict detector engine 420 and indirection table 404 are connected to memory channel 450 and are shared across the memory modules (452, 454, 456). Conflict detector engine 420 tracks row-access information and remap table 404 holds remap information across at least a subset of the memory banks in the memory modules (452, 454, 456).

In operation, to reduce row-buffer conflicts, conflict detector engine 420 triggers the migration of heavily conflicted rows within the banks of a rank to the less contended DRAM bank(s). A bank with few or no heavily conflicted rows is the destination for the migration (i.e., remapping). Such bank may have 1) no rows with more than N activations, 2) no rows with fewer than M average accesses per activation, or 3) a combination of 1 and 2, where N and M are the same as the previously defined variables. In one embodiment, conflict logic copies data from the source rows to free (unused) row(s) in the destination bank(s). In another embodiment, conflict detector engine 420 triggers (e.g., via an interrupt) a computing device within the system (e.g., processor 110 of system 100) to copy data from the source rows to free (unused) row(s) in the destination bank(s). Once the data copy is complete, the indirection table 404 is updated to reflect the corresponding remapping of the source row.

In a first example, a free list that an operating system (OS) maintains for tracking unused OS pages is used to identify a free DRAM row in a different bank as a destination for migration. Even if the granularity of DRAM rows is different from the OS pages (e.g., 2K row size vs. 4K page size), the free list is utilized to find a free row. When a free row is identified, the corresponding OS page is marked as used and is removed from the free list to prevent the OS from allocating the same page for other uses.

In another example, the conflict detector engine 420 contains hardware logic to determine the availability of free rows for remapping. A few rows of each bank (e.g., top-most X rows of every bank) are reserved initially for remapping. In one embodiment, a separate tracking table tracks the identification of rows that are reserved. When a reserved row is claimed for remapping, the row is marked in the tracking table. When a bank has no more free rows, it is no longer eligible for a destination of remapping until rows are freed again. In one embodiment, conflict logic dynamically evaluates when to increase, decrease, and/or defragment, or otherwise manage the reserved rows within one or more banks. Additionally, conflict logic determines when and which rows to revert to the original mappings.

In one embodiment, conflict detector engine 420 determines the need to restore the original mapping when it determines the bank is no longer heavily conflicted, a different row is identified to have more frequent performance-critical conflicts than the currently remapped rows, and/or the number of free OS pages reduces below a determined threshold. Accordingly, conflict detector engine 420 restores original mappings, thereby freeing up physical-address space in a bank.

Conflict detector engine 420 restores the original mapping by 1) copying the data in the remapped row back to the original row (if any writes are made after remapping), 2) updating the table for the set-aside rows, and 3) deallocating the corresponding entry in the indirection table 404. Conflict detector engine 420 and indirection table 404 can be shared by the memory modules that share the same address space or can be a per-memory-channel structure that constrains remapping only within memory channel 450. Alternatively, each processor core 212 or a group of cores 210 can have a copy of indirection table 404 that is synchronously updated. Indirection table 404 is accessed before memory requests are sent to the individual memory banks but after cache accesses. In one embodiment, indirection table 404 is indexed by the original bank and row identifications. Addresses that hit in indirection table 404 access the new bank and row specified in the corresponding table entry. Other addresses continue using previously defined, or default bank-row mapping. The indirection table 404 can be managed as a fixed-size content-addressable memory or SRAM. The number of table entries within indirection table 404 can be determined by simulation or area and/or power constraints. The remapping capacity provided by conflict detector engine 420 is proportional to the number of entries indirection table 404 includes.

Figure 5:
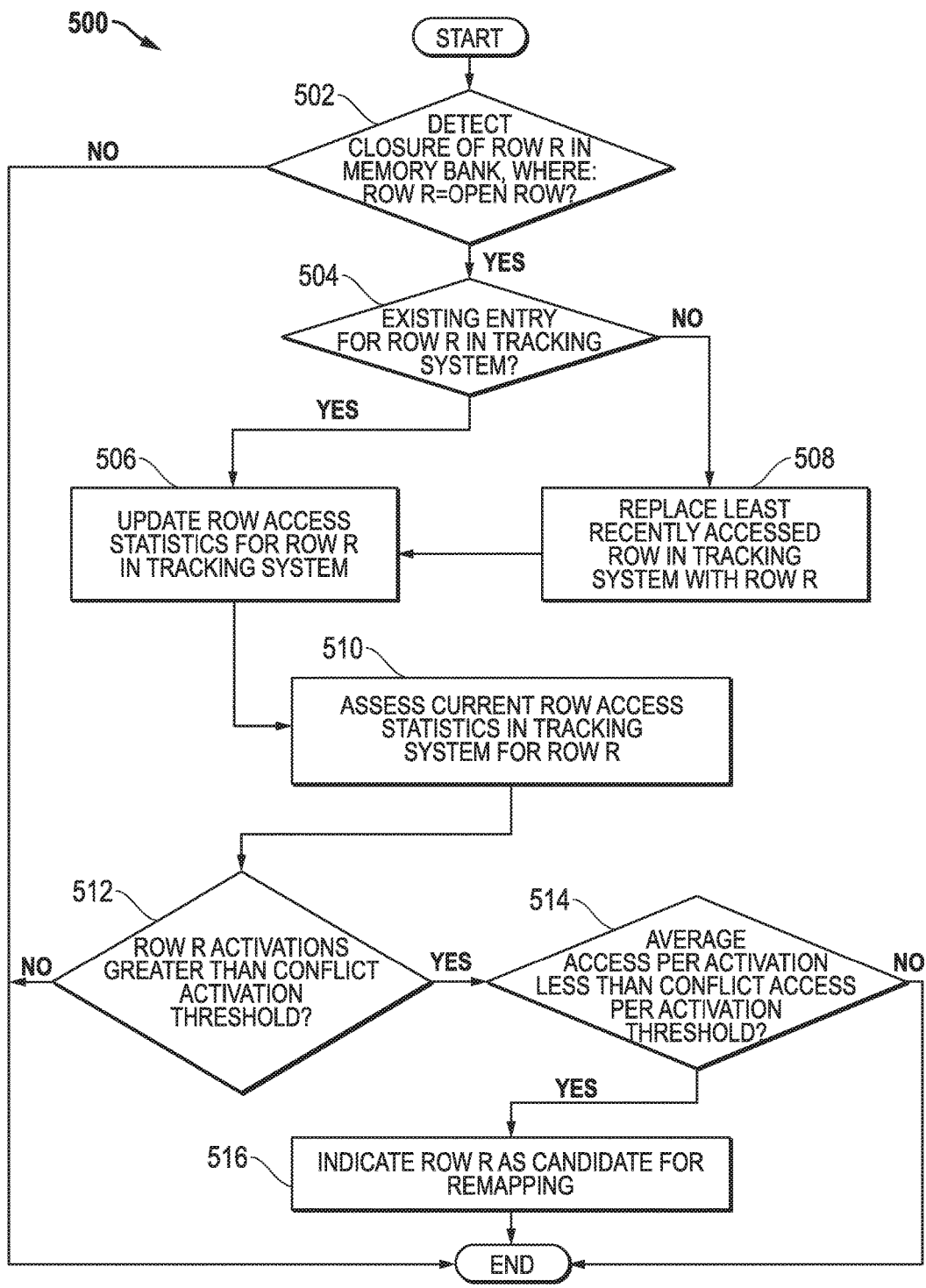
FIG. 5 illustrates a flow diagram for row-level conflict detection that may be used by the memory controller of FIG. 3 in some embodiments.

FIG. 5 illustrates a flow diagram method for row-level conflict detection that may be used by the memory controller of FIG. 3. Method 500 begins at the start block. A determination is made at block 502, whether conflict detector 320 detects closure of an open row, R, in a memory bank. If closure of row R is not detected, the process ends. If closure of row R is detected, the process continues to block 504. At block 504, conflict detector determines if there is an existing entry for row R in tracking system 314. If there is an existing entry for row R in tracking system 314, the process continues to block 506 where conflict detector 320 updates row access statistics for row R in tracking system 314. If there is not an existing entry for row R in tracking system 314, at block 508, conflict logic 312 replaces the least recently accessed row in tracking system 314 with row R, then continues to block 506. Conflict detector 320 assesses current row access statistics in tracking system 314 for row R, at block 510. A determination is made, at block 512, whether row R activations are greater than a dynamically or statically determined conflict activation threshold. If the number of row R activations is not greater than the conflict activation threshold, the process ends. If the number of activations is greater than the conflict activation threshold, the process continues to block 514. At block 514, conflict detector 320 determines whether the average number of accesses per activation is less than a determined conflict access threshold, where the threshold is dynamically or statically determined. If the average number of accesses per activation is not less than a determined conflict access threshold, the process ends. If the average number of accesses per activation is less than a determined conflict access threshold, the process continues to block 516. At block 516, conflict detector 320 indicates row R as a candidate for remapping (also described as migration). The process concludes at the end block.

Figure 6:
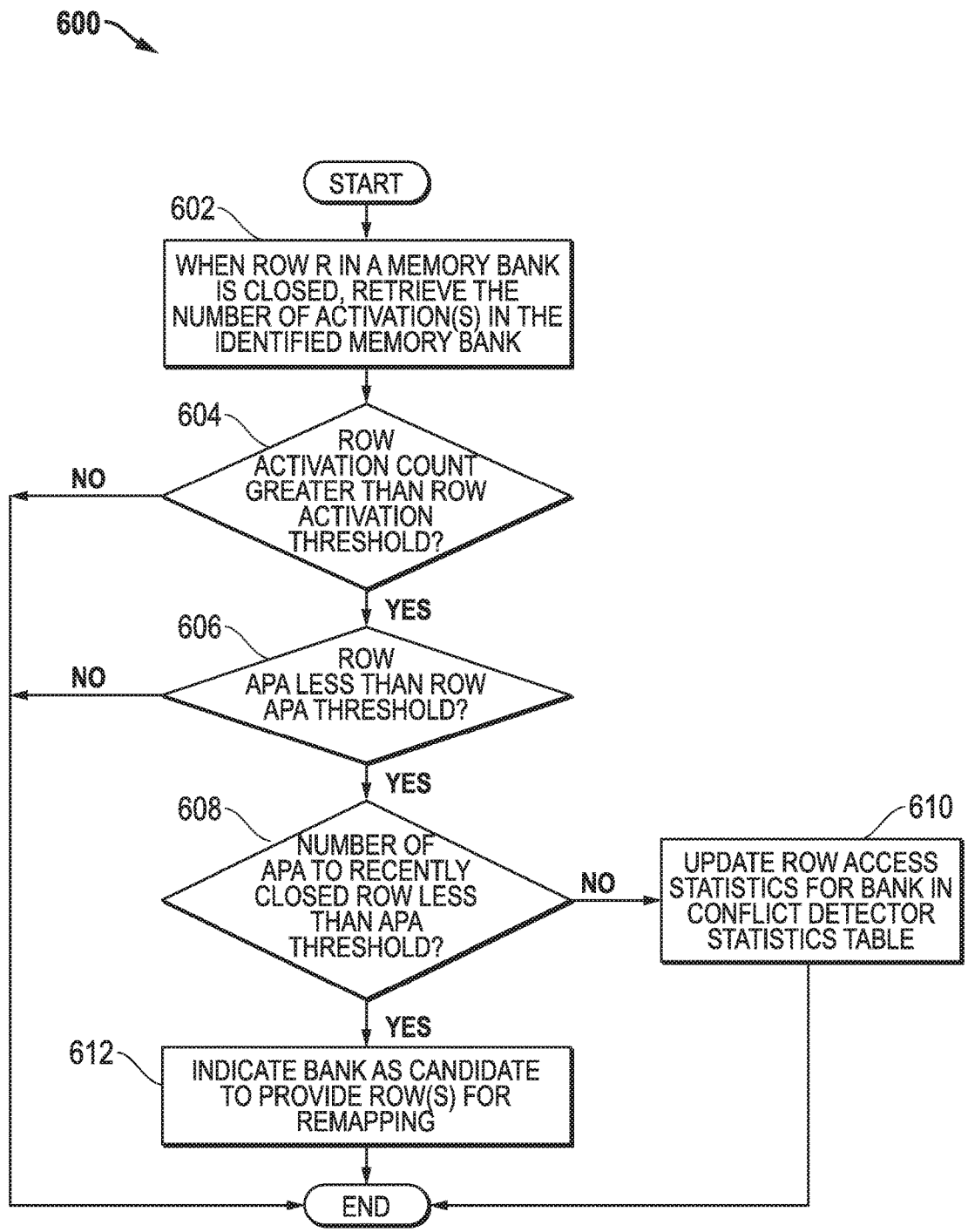
FIG. 6 illustrates a flow diagram for bank level conflict detection that may be used by the memory controller of FIG. 3 according to some embodiments.

FIG. 6 illustrates a flow diagram method for bank level conflict detection that may be used by the memory controller of FIG. 3. Method 600 begins at the start block and continues to block 602 where when a row of an identified memory bank is closed, the conflict detector retrieves the number of row activations in an identified memory bank. The conflict detector determines if the row activation count is greater than the row activation threshold, at block 604. If the row activation count is not greater than the row activation threshold, the process ends. If the row activation count is greater than the row activation threshold, the process continues to block 606. A determination is made at block 606 whether the number of row accesses per activation (APA) is less than the row accesses per activation threshold. If the number of row accesses per activation is not less than the row accesses per activation threshold, the process ends. If the number of row accesses per activation is less than the row accesses per activation threshold, the process continues to block 608. At block 608 another determination is made, whether the number of accesses per activation to recently closed rows is less than a determined row accesses per activation threshold. If the number of row accesses per activation to recently closed rows is less than a determined row accesses per activation threshold, the process continues to block 612. At block 612, conflict detector 320 indicates the specified bank as a candidate to provide rows for remapping (or migrating) rows. If the number of row accesses per activation to recently closed rows is not less than a determined access per activation threshold, the row access statistics within tracking system 314 are updated in block 610. The process concludes at the end block.

Figure 7:
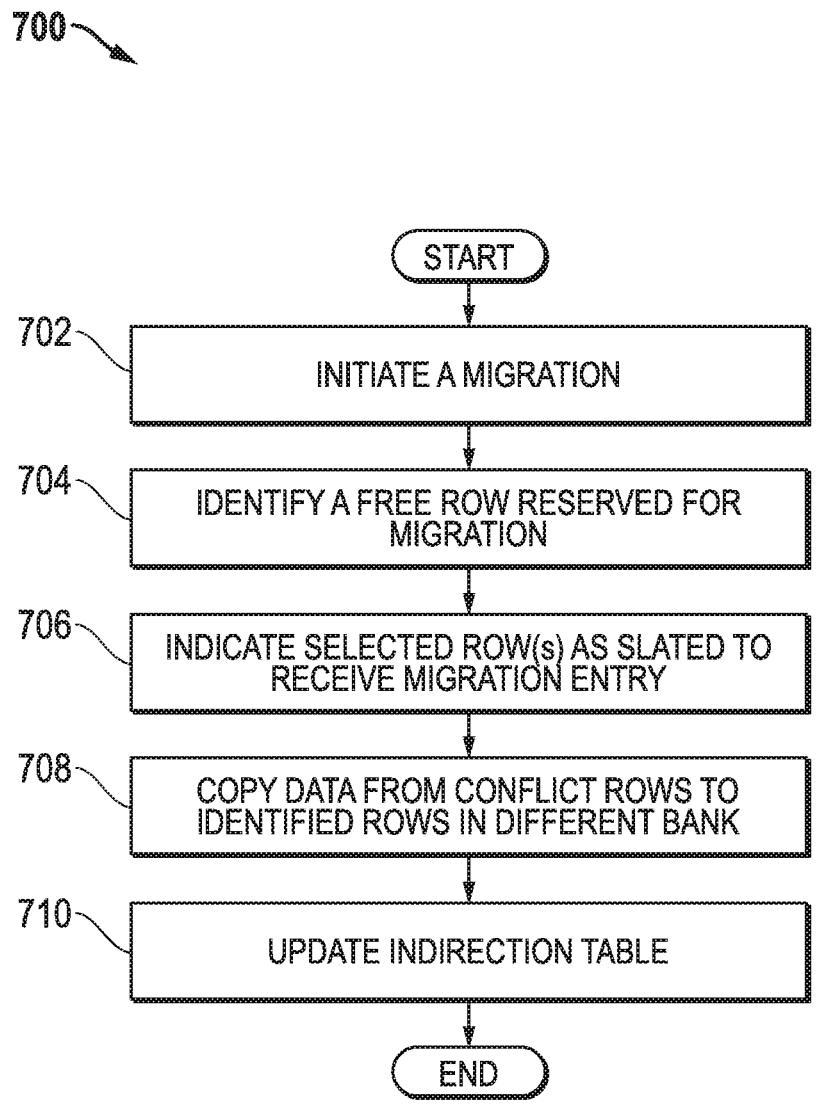
FIG. 7 illustrates a flow diagram for remapping memory that may be used by the memory controller of FIG. 3 in some embodiments.

FIG. 7 illustrates a flow diagram method for remapping memory that may be used by the memory controller of FIG. 3. Method 700 initiates at the start block. At block 702 conflict detector 320 initiates a migration (or remapping). At block 704, using the free row table, conflict detector 320 identifies a free row reserved for migration in a bank different from the migration source. At block 706, the selected rows are indicated as slated to receive the migration entry. At block 708, the data from the conflict rows is copied to the identified rows in the different bank. At block 710, conflict detector 320 updates indirection table 314 to reflect migration of the rows.

Figure 8:
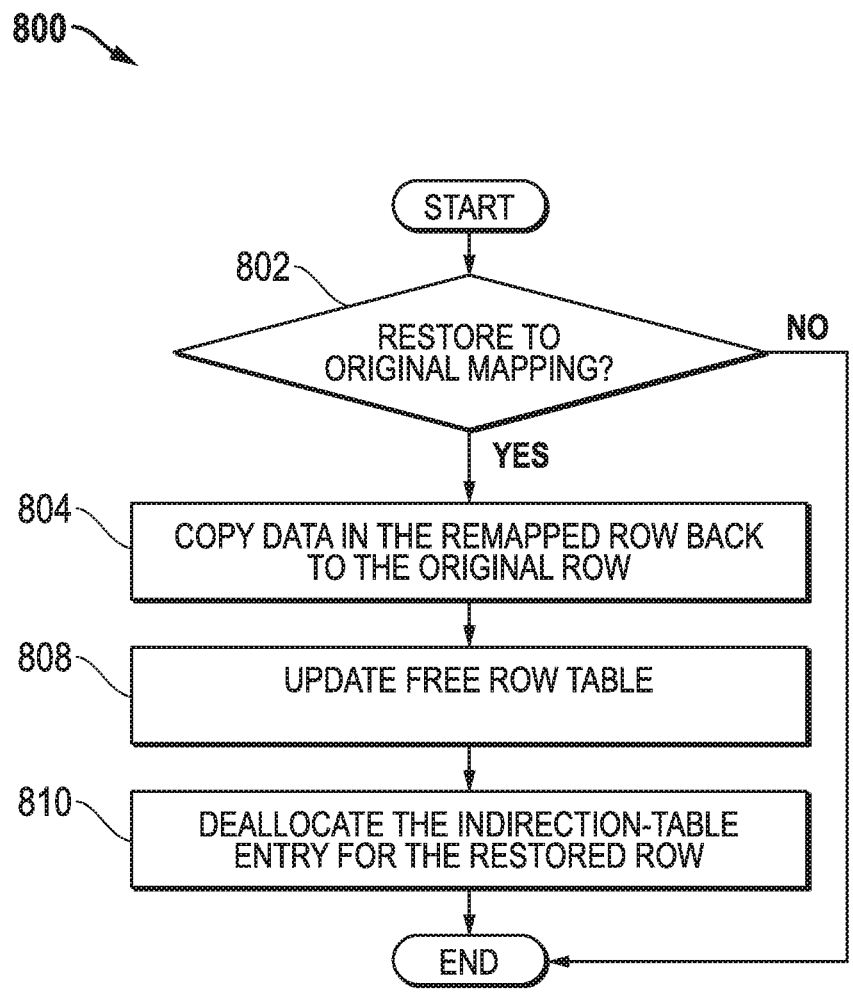
FIG. 8 illustrates a flow diagram for deallocating an indirection table entry that may be used by the memory controller of FIG. 3 according to some embodiments.

FIG. 8 illustrates a flow diagram method for deallocating an indirection table entry that may be used by the memory controller of FIG. 3. Method 800 initiates at the start block and continues to block 802. At block 802, conflict logic 312 determines whether to restore an original mapping of the indirection table. If conflict logic 312 determines not to restore indirection table 304 entry to the original mapping, the process ends. If conflict logic 312 determines to restore indirection table 304 entry to the original mapping, the process continues to block 804. At block 804, conflict logic 312 copies data in the remapped row of a bank back to the original row of the original bank. Conflict logic 312 updates free row table to indicate the availability of the newly freed remap row at block 806. At block 808, conflict logic 312 deallocates the entry in indirection table 304 for the restored row. The process concludes at the end block.

Some or all of the methods illustrated in FIG. 5, FIG. 6, FIG. 7 and FIG. 8 may be governed by instructions that are stored in a computer readable storage medium and that are executed by at least one processor. Each of the operations shown in FIG. 5, FIG. 6, FIG. 7 and FIG. 8 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. Memory controller 300 may interface to other types of memory besides DDRx memory, such as high bandwidth memory (HBM), types of synchronous DRAM, and the like. Although described in the context of DRAM-based memory, other memory systems, for instance, die-stacked DRAMs, and NVRAMs may also be utilized. For any memory technology, a "conflict" is described to be caused by interleaved memory-access streams to the same memory module that cause additional performance penalties. While the illustrated embodiment showed each rank of memory corresponding to separate DIMMs, in other embodiments each DIMM can support multiple ranks. Moreover, the memory channel may include a plurality of ranks of DDR memory or just a single rank.

Although the present invention has been described with reference to preferred embodiments, workers skilled in the art will recognize that changes may be made in form and detail without departing from the scope of the invention.

What is claimed is:

1. A memory controller, comprising:
    a decoder for receiving memory access requests, and decoding the memory access requests into decoded memory addresses, each of the decoded memory addresses including a bank address and a row address;
    a queue coupled to the decoder for storing the decoded memory addresses;
    an arbiter coupled to the queue for selecting entries from the queue efficiently based on the decoded memory addresses;
    a conflict detector, coupled to the arbiter for:
        identifying a frequent conflict of the entries selected by the arbiter, wherein a frequent conflict is a number of row-buffer conflicts in a subset of a memory exceeding a threshold; and
        selectively triggering remapping of a memory row associated with the frequent conflict from an original memory bank to a memory row in a second memory bank; and
    an indirection table coupled to the conflict detector and to the queue, for selectively providing at least one of: a remapped physical memory address and a hit signal indicating that data in a subset of memory for a physical memory address has been remapped to another subset of memory, and a miss signal indicating the data in the subset of memory has not been remapped to another subset of memory.

2. The memory controller of claim 1, wherein to determine a rate of frequent conflicts, the arbiter is adapted to provide at least one of:
    row access information associated with a memory row to the conflict detector; and
    per-bank access information associated with a memory bank to the conflict detector.

3. The memory controller of claim 1, wherein the conflict detector monitors a memory row activation count and a memory row access per activation count.

4. The memory controller of claim 3, wherein the conflict detector determines the frequent conflict of the subset of the memory if the memory row activation count for a memory row is greater than a predetermined memory activation count threshold, and the memory row access per activation count is less than a predetermined memory row access per activation count threshold.

5. The memory controller of claim 1, wherein:
    the conflict detector maintains row-access information for a recently accessed number of rows in the memory; and
    the conflict detector updates the row-access information in response to closure of an open row in the memory.

6. The memory controller of claim 1, wherein the conflict detector, having a tracking system, tracks a rate of frequent conflicts by implementing at least one of:
    a cache having tracking information with a memory row granularity replacement policy;
    a tracking algorithm; and
    a table of access statistics.

7. The memory controller of claim 1, wherein to detect a rate of frequent conflicts, the conflict detector identifies rows that are most frequently opened and closed with fewer than a threshold number of intervening accesses.

8. The memory controller of claim 1, wherein the conflict detector determines that the frequent conflict is associated with a memory bank if a per-bank activation count is greater than a predetermined per-bank activation count threshold, and a per-bank access per activation count is less than a predetermined per-bank access per activation count threshold in the memory bank.

9. The memory controller of claim 1, wherein the conflict detector selectively copies data from a row in a subset of memory experiencing frequent conflicts to another subset of memory with at least fewer conflicting rows.

10. The memory controller of claim 1, wherein:
    the remapped physical memory address corresponds to a bank with at least fewer conflicting rows than the original memory bank; and
    the original memory bank is associated with the physical memory address causing the frequent conflict.

11. A data processing system, comprising:
    a memory comprising a first memory bank and a second memory bank;
    a decoder for receiving memory access requests, and decoding the memory access requests into decoded memory addresses, each of the decoded memory addresses including a bank address and a row address;
    a queue coupled to the decoder for storing the decoded memory addresses;

an arbiter coupled to the queue for selecting entries from the queue efficiently based on the decoded memory addresses;

a conflict detector coupled to the memory and adapted to receive memory access information, wherein the conflict detector:

tracks memory access statistics of the first memory bank;

determines if the first memory bank contains frequent row conflicts of the entries selected by the arbiter; and remaps a frequent row conflict in the first memory bank to the second memory bank; and an indirection table coupled to the conflict detector and adapted to:

receive a memory access request; and redirect an address into a dynamically selected physical memory address in response to a remapping of the frequent row conflict to the second memory bank.

12. The data processing system of claim 11, further comprising:

a queue for storing the dynamically selected physical memory address from the indirection table; and an arbiter for selecting the dynamically selected physical memory address from among a group of dynamically selected physical memory addresses pending in the queue to issue to a memory channel.

13. The data processing system of claim 11, wherein the conflict detector comprises:

a tracking system for storing memory access statistics; and conflict logic that determines, from the memory access statistics, when a memory row is associated with a frequent row conflict.

14. The data processing system of claim 13, wherein the tracking system monitors at least one of selective rows in a memory and selective banks in the memory to provide memory access statistics to the conflict logic.

15. The data processing system of claim 13, wherein the conflict logic compares the memory access statistics to at least one predetermined threshold to determine if the memory row is associated with the frequent row conflict.

16. The data processing system of claim 13, wherein the conflict logic determines when a row has an activation count higher than a predetermined activation count threshold and when an access per activation count is lower than a predetermined access per activation count threshold in response to the memory access statistics in the tracking system.

17. The data processing system of claim 16, wherein when the activation count is higher than the predetermined activation count threshold and the access per activation count is lower than the predetermined access per activation count threshold, the row is associated with a frequent row conflict and the row is a candidate for remapping to the second memory bank.

18. The data processing system of claim 11, wherein the second memory bank is a memory bank with at least fewer conflicting rows than a bank associated with the row causing the frequent row conflict.

19. The data processing system of claim 11, wherein the conflict detector maintains per-bank activation counts and per-bank accesses per activation counts.

20. The data processing system of claim 11, wherein the conflict detector maintains statistics on per-bank row openings and accesses for a subset of rows associated with each bank in the memory, and when one of the subset of rows is closed with fewer than a predetermined threshold of accesses, an associated row identification and number of accesses associated with a closed row is stored for a corresponding bank in the memory.

21. The data processing system of claim 11, further comprising:

a memory accessing agent coupled to a memory controller for providing memory access requests thereto; and at least a portion of the conflict detector and the memory controller are combined in a single integrated circuit chip.

22. The data processing system of claim 11, wherein the conflict detector identifies at least one free memory row by utilizing an operating system free list to determine a target for remapping.

23. The data processing system of claim 11, wherein the conflict detector identifies when fewer than a predetermined number of frequent row conflict memory requests to the first memory bank is received subsequent to remapping.

24. The data processing system of claim 23, wherein in response to fewer than a predetermined number of frequent row conflict memory requests being received to the first memory bank, the conflict detector restores an original mapping to the first memory bank.

25. The data processing system of claim 11, wherein the indirection table further:

associates with at least one of a selected group of memory modules, all memory modules that share a same address space, per-memory channel, per processor core, and all processor cores;

shares row-access information across at least one of the memory modules and the processor cores; and synchronously updates the row-access information across at least one of the memory modules and the processor cores.

26. A method for conflict detection based on access statistics to a subset of a memory, comprising:

detecting closure of an open row in the subset of the memory;

selectively monitoring activity of at least one row in the subset of the memory;

in response to a row associated with a most recent row closure being stored in a tracking system, updating row access statistics corresponding to the row;

in response to the row associated with a most recent row activity not being in the tracking system, replacing row access statistics of one of: a not-recently accessed row and a most accesses per activation row, in the tracking system, with the row access statistics associated with a most recent row closure; and comparing a row accesses per activation count to a predetermined row accesses per activation threshold for at least one row in the subset of the memory to determine if a row is a candidate for remapping.

27. The method of claim 26, further comprising:

in response to the comparing, selectively indicating a row as a candidate to provide a frequently conflicting row as a candidate to remap to an alternate memory bank.

28. A method for remapping memory requests in a subset of a memory to a different bank in the memory, the method comprising:

decoding received memory access requests into decoded memory addresses, each of the decoded memory addresses including a bank address and a row address;

storing the decoded memory addresses in a queue;

selecting entries from the queue efficiently based on the decoded memory addresses;

detecting a frequent row conflict in response to selecting the entries from the queue;

detecting, at an indirection table, a request for a remap entry from a conflict detector;

identifying, at a free row table, that at least one row in the different bank is reserved and available for remapping;

indicating at least one memory row is slated to receive a remapped memory row;

copying data from one or more conflict rows to identified rows in the different bank with fewer conflicts; and updating one or more of: the free row table and the indirection table.

29. The method of claim 28, further comprising:

determining if a remapped memory row is to be restored to an original mapping;

in response to a determination to restore to the original mapping, copying data in a remapped row back to an original row;

updating the free row table; and deallocating an indirection table entry for a restored row.

* * * * *